United States Patent
Qian et al.

(10) Patent No.: US 11,268,187 B2
(45) Date of Patent: Mar. 8, 2022

(54) POROUS ALUMINUM MACROSCOPIC BODY AND FABRICATION SYSTEM AND METHOD THEREFOR

(71) Applicants: JIANGSU ZHONGTIAN TECHNOLOGY CO., LTD., Nantong (CN); ZHONGTIAN SUPERCAPACITOR TECHNOLOGY CO., LTD., Nantong (CN); Tsinghua University, Beijing (CN)

(72) Inventors: Wei-Zhong Qian, Nantong (CN); Ji-Ping Xue, Nantong (CN); Zhou-Fei Yang, Nantong (CN); Wei-Ren You, Nantong (CN); Ying Jin, Nantong (CN); Sun-Wang Gu, Nantong (CN)

(73) Assignees: JIANGSU ZHONGTIAN TECHNOLOGY CO., LTD., Nantong (CN); ZHONGTIAN SUPERCAPACITOR TECHNOLOGY CO., LTD., Nantong (CN); Tsinghua University, Beijing (CN)

( * ) Notice: Subject to any disclaimer, the term of this patent is extended or adjusted under 35 U.S.C. 154(b) by 0 days.

(21) Appl. No.: 16/893,644

(22) Filed: Jun. 5, 2020

(65) Prior Publication Data
US 2020/0299827 A1   Sep. 24, 2020

Related U.S. Application Data

(63) Continuation-in-part of application No. PCT/CN2019/078190, filed on Mar. 14, 2019.

(30) Foreign Application Priority Data

Mar. 16, 2018   (CN) .......................... 201810220747.6

(51) Int. Cl.
*C23C 14/35* (2006.01)
*C23C 14/20* (2006.01)
(Continued)

(52) U.S. Cl.
CPC ............ *C23C 14/35* (2013.01); *C23C 14/046* (2013.01); *C23C 14/20* (2013.01);
(Continued)

(58) Field of Classification Search
CPC ....... C23C 14/35; C23C 14/046; C23C 14/20; C23C 14/5873; C23C 14/025;
(Continued)

(56) References Cited

U.S. PATENT DOCUMENTS

2005/0217584 A1* 10/2005 Abiko .................. C23C 14/545
                                                          118/726
2006/0283382 A1* 12/2006 Yoshikawa ........... C23C 14/243
                                                          117/200
(Continued)

FOREIGN PATENT DOCUMENTS

CN        102212791       10/2011
EP        3093861         11/2016
(Continued)

OTHER PUBLICATIONS

KR-20070056190-A Translation (Year: 2007).*

*Primary Examiner* — Jennifer Wecker
*Assistant Examiner* — Patrick S Ott
(74) *Attorney, Agent, or Firm* — ScienBiziP, P.C.

(57) ABSTRACT

Disclosed are a porous aluminum macroscopic body, a fabrication system, and a method therefor, where the porous aluminum macroscopic body is a three-dimensional full-through-hole structure formed by connecting hollow aluminum wires, and the wall thickness of the hollow aluminum wires is 7-100 micrometers. The fabrication system com-
(Continued)

prises a magnetron sputtering subsystem, a high-temperature aluminum vapor subsystem, a low-temperature aluminum deposition subsystem, an aluminum vapor recovery subsystem, and a porous polymer film conveying subsystem. A preparation method therefor comprises first utilizing a magnetron sputtering method to rapidly sputter on a porous polymer film to form an aluminum layer that has a thickness of 1-500 nm, and then continuing to deposit the aluminum layer to a thickness of 7-100 micrometers while decomposing the polymer film in-situ so as to obtain the porous aluminum macroscopic body.

2 Claims, 1 Drawing Sheet

(51) Int. Cl.
*C23C 14/58* (2006.01)
*C23C 14/04* (2006.01)
*H01G 11/70* (2013.01)
*H01M 4/66* (2006.01)
*H01M 4/76* (2006.01)

(52) U.S. Cl.
CPC .......... *C23C 14/5873* (2013.01); *H01G 11/70* (2013.01); *H01M 4/661* (2013.01); *H01M 4/762* (2013.01)

(58) Field of Classification Search
CPC ..... C23C 14/562; C23C 14/24; C23C 14/205; C23C 20/00; C23C 14/024; C23C 14/246; C23C 28/00; C23C 28/02; C23C 28/023; H01L 21/67155; H01G 11/70; H01G 11/68; H01G 11/84; H01M 4/661; H01M 4/762; H01M 4/74; H01M 4/668; H01M 4/80; Y02E 60/10
USPC ........................................ 204/298.24, 298.26
See application file for complete search history.

(56) References Cited

U.S. PATENT DOCUMENTS

| | | | |
|---|---|---|---|
| 2010/0068375 A1* | 3/2010 | Kawakami | C23C 14/568 427/66 |
| 2012/0067731 A1* | 3/2012 | Hosoe | H01G 9/155 205/50 |
| 2012/0070683 A1 | 3/2012 | Hosoe et al. | |
| 2012/0288758 A1 | 11/2012 | Hosoe et al. | |
| 2016/0043227 A1* | 2/2016 | Zhang | H01L 21/461 257/43 |

FOREIGN PATENT DOCUMENTS

| | | |
|---|---|---|
| JP | H06-010077 | 1/1994 |
| JP | H09-031629 | 2/1997 |
| JP | 2011-236476 | 11/2011 |
| KR | 20070056190 A * | 6/2007 |
| WO | 2014002777 | 1/2014 |

\* cited by examiner

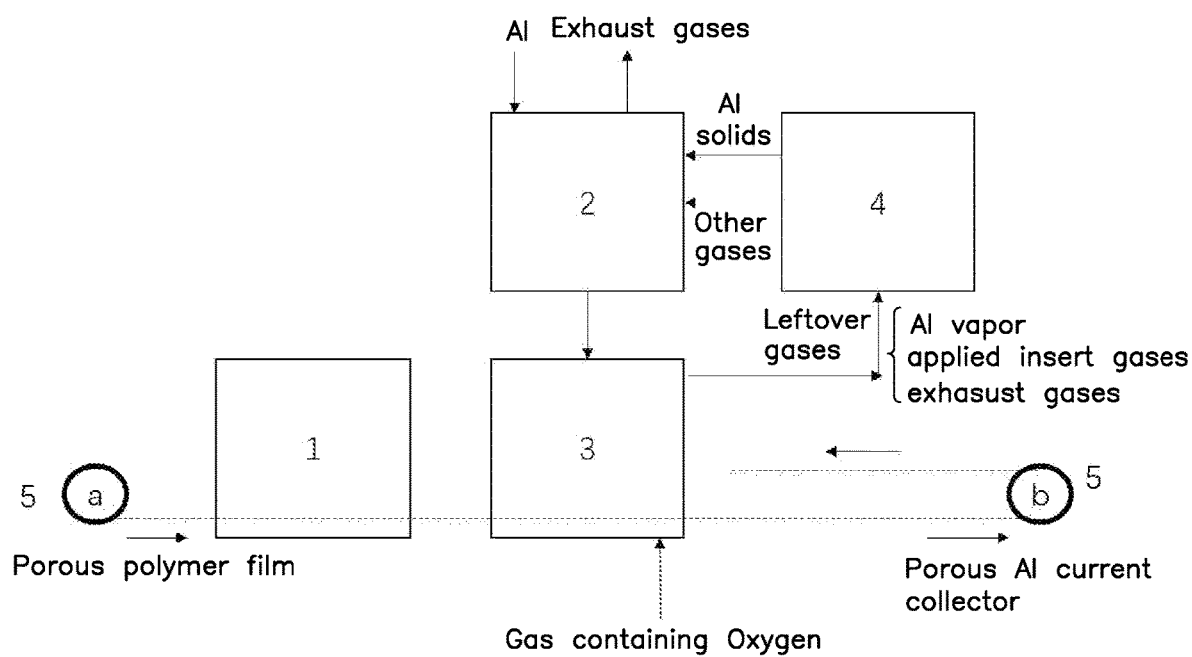

POROUS ALUMINUM MACROSCOPIC BODY AND FABRICATION SYSTEM AND METHOD THEREFOR

CROSS-REFERENCE TO RELATED APPLICATIONS

This application is a continuation in part of application of PCT patent application Serial Number PCT/CN2019/078190, filed on Mar. 14, 2019, which claims priority to CN Patent Application Serial Number 201810220747.6, filed on Mar. 16, 2018, the disclosure of which is incorporated herein by reference.

FIELD

The subject matter herein generally relates to a porous aluminum macroscopic body, a fabrication system, and a method therefor.

BACKGROUND

Super capacitors and various secondary batteries are the subject of research fields in clean electrochemical energy storage in the world. They have characteristics of reversible charge and discharge, so that they can store energy, drive power equipment, such as vehicles, lifting machinery, power blades, circuit switches, and act as various power sources. Common structural characteristics of super capacitors and various secondary batteries or their hybrid products are that they have active materials, positive and negative electrodes, separators, and current collectors. Non-porous, flat, high conductivity and mechanically strong metal foil (such as an aluminum foil) is always used as traditional current collector (collecting current). To increase the mass of the active material in a device as much as possible, the active material and adhesive are fixed to the surface of the macroscopic body by means of mixing slurry, coating, drying, and calendaring. This method has achieved large industrialization.

The active materials used in many super capacitors are various carbon or carbon materials. The active materials used in many secondary batteries, such as lithium ion batteries, are often various inorganic lithium compounds. At the same time, the necessary accessories such as diaphragms, electrolytes, etc., have a lower intrinsic density than that of many metals. Therefore, the traditional non-porous macroscopic body with a large mass proportion of whole devices has shortcomings in pursuing of the quality energy density and volume energy density of devices. The traditional processing method of bonding active materials to macroscopic bodies of non-porous metals also has a disadvantage of being difficult to disassemble and recycle, which are costly and not environmentally-friendly.

Considering the importance of aluminum current collectors, a variety of methods for preparation of porous aluminum macrostructures have been proposed, including electroplating or physical sputtering using a polyurethane template. After removing the polyurethane template, the porosity of these porous hollow aluminum macrostructures can be up to 97%, the conductivity is very good, and the structures are very light. However, the method of electroplating aluminum uses expensive reagents such as aluminum-containing ionic liquids, and water in the system must be avoided because of the decomposition of ionic liquids. These methods form strongly corrosive substances such as $AlCl_3$ and acid mist such as HCl. The above-mentioned features also make the cost of water removal of the porous polyurethane film increase. The simple physical sputtering method overcomes the shortcomings of electroplating aluminum, but its equipment is limited and large-area samples cannot be achieved, the aluminum deposition rate is also too slow. There are industrial methods of high-temperature physical vapor aluminum, but high-temperature aluminum vapor causes the porous polyurethane film to melt, and no passable samples can be obtained.

SUMMARY OF THE INVENTION

A porous aluminum macroscopic body provided according to the present disclosure is a three-dimensional full-through-hole structure formed by connecting hollow aluminum wires. A wall thickness of the hollow aluminum wire is 7-100 microns, the porous aluminum macroscopic body has an overall porosity of 85-99%, a tensile strength of 0.4-2 MPa, and a compressive strength of 1-3.5 MPa, and its hollow pores are closed and sealed.

The present disclosure further provides a fabrication system for preparing a porous aluminum macroscopic body. The fabrication system comprises a magnetron sputtering subsystem 1, a high-temperature aluminum vapor subsystem 2, a low-temperature aluminum deposition subsystem 3, an aluminum vapor recovery subsystem 4, and a porous polymer film conveying subsystem 5. The porous polymer film conveying subsystem 5 is connected with the magnetron sputtering subsystem 1 and the low-temperature aluminum deposition subsystem 3 to form a path for a porous polymer film. The high-temperature aluminum vapor subsystem 2, the low-temperature aluminum deposition subsystem 3, and the aluminum vapor recovery subsystem 4 are interconnected to form paths for supply, deposition, and recovery of aluminum.

Preferably, the low-temperature aluminum deposition subsystem 3 is provided with an inlet for a gas containing oxygen in a direction near the porous polymer film conveying subsystem 5 at a rear end. While depositing an aluminum vapor, the porous polymer film is completely burned by utilizing the temperature of the aluminum vapor, so an aluminizing film which comes out of the low-temperature aluminum deposition subsystem 3 is without any carbon element. Preferably, the low-temperature aluminum deposition subsystem 3 has a plurality of channels for depositing the aluminum vapor, so that the aluminizing film moved from the low-temperature aluminum deposition subsystem 3 to the porous polymer film conveying subsystem 5 can be in contact with the gas containing oxygen. The aluminizing film returned from the porous polymer film conveying subsystem 5 to the low-temperature aluminum deposition subsystem 3 is no longer in contact with the gas containing oxygen. Preferably, the aluminum vapor recovery subsystem 4 includes an air induction system to introduce leftover gases containing applied inert gas, exhaust gases caused by burning the porous polymer film, and excess aluminum vapor in the low-temperature aluminum deposition subsystem 3 into the aluminum vapor recovery subsystem 4. The aluminum vapor condenses into solids of aluminum by cooling, and the aluminum solids are separated from other gases of the leftover gases, the aluminum solids and other gases return to the high-temperature aluminum vapor subsystem 2 respectively. Preferably, the high-temperature aluminum vapor subsystem 2 converts the aluminum solids recovered from the aluminum vapor recovery subsystem 4 and aluminum particles from outside into aluminum vapor. At the same time, the other gases passed into the aluminum vapor recovery subsystem 4 are carried out a harmless combustion treatment to be turned into an exhaust gas, and the exhaust gas is expelled from the high temperature aluminum vapor subsystem 2. Preferably, the gas containing oxygen is argon gas or nitrogen gas with 2-10% oxygen gas added.

A method for preparing a porous aluminum macroscopic body is also disclosed. The method comprises following steps:

(a) winding a porous polymer film with a thickness of 0.5-30 mm, a width of 1-500 mm, and an aspect ratio of 400:1-400,000:1 on a reel a of a porous polymer film conveying subsystem 5 and feeding the porous polymer film into a magnetron sputtering subsystem 1 at a speed of 1-20 cm/min; setting the surface power of an aluminum target in the magnetron sputtering subsystem 1 to be 2-10 $W/cm^2$, depositing aluminum atoms sputtered from the aluminum target on one side of the porous polymer film to form an aluminum layer with a thickness of 1-500 nm in an inert gas environment at 25-50 degrees Celsius and an absolute pressure of 0.5-5 Pa;

(b) starting a high-temperature aluminum vapor subsystem 2; melting a number of aluminum particles at 600-800 degrees Celsius in a melting bath of the high-temperature aluminum vapor subsystem 2, converting the molten aluminum particles to aluminum vapor with a partial pressure of 0.1-10% in the existence of an inert gas such as nitrogen or argon, and delivering the aluminum vapor to a low-temperature aluminum deposition subsystem 3;

(c) feeding continuously the porous polymer film coming out of the magnetron sputtering subsystem 1 into the low-temperature aluminum deposition subsystem 3, setting the temperature of the low-temperature aluminum deposition subsystem 3 to be 200-300 degrees Celsius, and depositing directly the aluminum vapor on the side of the porous polymer film deposited with the aluminum atoms to form an aluminizing film in a certain time of 1-30 minutes;

(d) winding the aluminizing film coming out of the low-temperature aluminum deposition subsystem 3 on a reel b of the porous polymer film conveying subsystem 5, turning the aluminizing film over automatically, and returning the aluminizing film to the magnetron sputtering subsystem 1 and the low-temperature aluminum deposition subsystem 3 in turn to deposit aluminum atoms and aluminum vapor on the aluminizing film to obtain the porous aluminum macroscopic body with an uniform aluminizing thickness on upper and lower sides for use of a porous aluminum current collector;

(e) transporting leftover gases including excess aluminum vapor in the low-temperature aluminum deposition subsystem 3 through an aluminum vapor recovery subsystem 4 to the high-temperature aluminum vapor subsystem 2 for recycling aluminum and inert gases.

Preferably, the aluminizing film coming out of the low-temperature aluminum deposition subsystem 3 is comprised of hollow aluminum wires with all hollow holes in contact with the external medium. The diameter of aluminum wires becomes larger after returning to the low-temperature aluminum deposition subsystem 3 and the magnetron sputtering subsystem 1 by the porous polymer film conveying subsystem 5, and all hollow holes are sealed and closed. Preferably, the porous polymer film comprises, but is not limited to, a porous film of polyurethane, polyolefin, polyvinylidene fluoride, and poly tetra fluoroethylene. Preferably, the high-temperature aluminum vapor subsystem 2 converts solids of aluminum recovered from the aluminum vapor recovery subsystem 4 and aluminum particles from outside into aluminum vapor through a high temperature melting method in the high-temperature aluminum vapor subsystem 2.

BRIEF DESCRIPTION OF THE DRAWING

Implementations of the present technology will now be described, by way of embodiments, with reference to the attached figures.

FIG. 1 is a schematic diagram of a fabrication system for preparing a porous aluminum macroscopic body in an embodiment of the present disclosure.

DETAILED DESCRIPTION OF EMBODIMENTS

It will be appreciated that for simplicity and clarity of illustration, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts have been exaggerated to better illustrate details and features of the present disclosure. The description is not to be considered as limiting the scope of the embodiments described herein.

Several definitions that apply throughout this disclosure will now be presented. The term "comprising" means "including, but not necessarily limited to"; it specifically indicates open-ended inclusion or membership in a so-described combination, group, series, and the like. The term "coupled" is defined as connected, whether directly or indirectly through intervening components, and is not necessarily limited to physical connecting. The coupling can be such that the objects are permanently connected or releasably connected. The term "substantially" means essentially conforming to the particular dimension, shape, or other feature that the term modifies, but such that the component needs not have that exact feature.

It should be noted that, when an element is considered to be "fixed to" another element, which can be either directly fixed on another element or indirectly fixed on another element with a centered element. When an element is considered to be "coupled with" another element, which can be either directly coupled with another element or indirectly coupled with another element with a centered element at the same time.

Unless otherwise defined, all technical and scientific terms used herein have the same meaning as commonly understood by one skilled in the art. The terms used in a specification of the present application herein are only for describing specific embodiments, and are not intended to limit the present application. The terms "and/or" used herein includes any and all combinations of one or more of associated listed items.

The present disclosure is described with reference to the drawing and specific embodiments.

Example 1

Referring to FIG. 1, a porous film of polyurethane (PU) with a thickness of 0.5 mm, a width of 1 mm, and an aspect ratio of 400,000:1 was wound on a reel a of a porous polymer film conveying subsystem 5 and fed into a magnetron sputtering subsystem 1 at a speed of 1 cm/min. In an inert gas (argon gas) environment at 25 degrees Celsius and an absolute pressure of 5 Pa, the surface power of an aluminum target in the magnetron sputtering subsystem 1 was controlled to be 2 W/cm$^2$, so that the aluminum target sputtered aluminum atoms to be continuously deposited on one side of the porous film of PU. An aluminum layer was thus formed with a thickness of 1 nm. A high-temperature aluminum vapor subsystem 2 was started. A number of aluminum particles were melted at 600 degrees Celsius in the existence of an inert gas (nitrogen gas) in a melting bath of the high-temperature aluminum vapor subsystem 2. The molten aluminum particles were converted to an aluminum vapor with a partial pressure of 0.1% in the existence of nitrogen gas, and the aluminum vapor was delivered to a low-temperature aluminum deposition subsystem 3. The temperature of the low-temperature aluminum deposition subsystem 3 was set to 200 degrees Celsius, the porous film of PU coming out of the magnetron sputtering subsystem 1 was continuously fed into the low-temperature aluminum deposition subsystem 3. The aluminum vapor was directly deposited on the side of the porous film of PU deposited with the aluminum atoms to form an aluminizing film, the deposition time was controlled at 30 minutes. A nitrogen gas containing 2% oxygen was injected into the low-temperature aluminum deposition subsystem 3 from an inlet at a rear end to oxidize and remove the porous film of PU, and reduce the oxygen content of leftover gases from the low-temperature aluminum deposition subsystem 3 to an aluminum vapor recovery subsystem 4 to less than 1%. The aluminizing film coming out of the low-temperature aluminum deposition subsystem 3 was wound on a reel b of the porous polymer film conveying subsystem 5, the aluminizing film could be automatically turned over and returned to the magnetron sputtering subsystem 1 and the low-temperature aluminum deposition subsystem 3 in turn to deposit aluminum atoms and aluminum vapor on the aluminizing film to obtain a porous aluminum macroscopic body with an uniform aluminizing thickness on upper and lower sides for use of a porous aluminum current collector. The porous aluminum macroscopic body is a three-dimensional full-through-hole structure formed by connecting hollow aluminum wires, a wall thickness of the hollow aluminum wire is 20 microns. The porous aluminum macroscopic body has an overall porosity of 95%, a tensile strength of 1 MPa, and a compressive strength of 1.5 MPa.

Leftover gases containing excess aluminum vapor, applied inert gas (nitrogen gas), and exhaust gases caused by burning the porous film of PU in the low-temperature aluminum deposition subsystem 3 were introduced into the aluminum vapor recovery subsystem 4. The excess aluminum vapor was condensed into solids of aluminum by cooling and separated from the leftover gases. Through cooling and separation, the aluminum solids and other gases were separated into two paths, and returned to the high-temperature aluminum vapor subsystem 2. The recovered aluminum solids and aluminum particles from outside were simultaneously used to generate high-temperature aluminum vapor. The other gases from the aluminum vapor recovery subsystem 4 were handled by to a harmless combustion treatment to be turned into an exhaust gas.

Example 2

Referring to FIG. 1, a porous film of PVDF (polyvinylidene fluoride) with a thickness of 30 mm, a width of 500 mm, and an aspect ratio of 400:1 was wound on a reel a of a porous polymer film conveying subsystem 5 and fed into a magnetron sputtering subsystem 1 at a speed of 20 cm/min. In an inert gas (argon gas) environment at 50 degrees Celsius and an absolute pressure of 0.5 Pa, the surface power of an aluminum target in the magnetron sputtering subsystem 1 was controlled to be 10 W/cm$^2$, so that the aluminum target sputtered aluminum atoms to be continuously deposited on one side of the porous film of PVDF. An aluminum layer was thus formed with a thickness of 500 nm. A high-temperature aluminum vapor subsystem 2 was started. A number of aluminum particles were melted at 800 degrees Celsius in the existence of an inert gas (nitrogen gas) in a melting bath of the high-temperature aluminum vapor subsystem 2. The molten aluminum particles were converted to an aluminum vapor with a partial pressure of 10% in the existence of nitrogen gas, and the aluminum vapor was delivered to a low-temperature aluminum deposition subsystem 3. The temperature of the low-temperature aluminum deposition subsystem 3 was set to 300 degrees Celsius, the porous film of PVDF coming out of the magnetron sputtering subsystem 1 was continuously fed into the low-temperature aluminum deposition subsystem 3. The aluminum vapor was directly deposited on the side of the porous film of PVDF deposited with the aluminum atoms to form an aluminizing film, the deposition time was controlled at 1 minute. A nitrogen gas containing 10% oxygen was injected into the low-temperature aluminum deposition subsystem 3 from an inlet at a rear end to oxidize and remove the porous film of PVDF, and reduce the oxygen content of leftover gases from the low-temperature aluminum deposition subsystem 3 to an aluminum vapor recovery subsystem 4 to less than 1%. The aluminizing film coming out of the low-temperature aluminum deposition subsystem 3 was wound on a reel b of the porous polymer film conveying subsystem 5, the aluminizing film could be automatically turned over and returned to the magnetron sputtering subsystem 1 and the low-temperature aluminum deposition subsystem 3 in turn to deposit aluminum atoms and aluminum vapor on the aluminizing film to obtain a porous aluminum macroscopic body with an uniform aluminizing thickness on upper and lower sides for use of a porous aluminum current collector. The porous aluminum macroscopic body is a three-dimensional full-through-hole structure formed by connecting hollow aluminum wires, a wall thickness of the hollow aluminum wire is 100 microns. The porous aluminum macroscopic body has an overall porosity of 85%, a tensile strength of 2 MPa, and a compressive strength of 3.5 MPa.

Leftover gases containing excess aluminum vapor, applied inert gas (nitrogen gas), and exhaust gases caused by burning the porous film of PVDF in the low-temperature aluminum deposition subsystem 3 were introduced into the aluminum vapor recovery subsystem 4. The excess aluminum vapor was condensed into solids of aluminum by cooling and separated from the leftover gases. Through cooling and separation, the aluminum solids and other gases were separated into two paths, and returned to the high-temperature aluminum vapor subsystem 2. The recovered aluminum solids and aluminum particles from outside were simultaneously used to generate high-temperature aluminum vapor. The other gases from the aluminum vapor recovery subsystem 4 were handled by to a harmless combustion treatment to be turned into an exhaust gas.

Example 3

Referring to FIG. 1, a porous film of PTFE (polytetrafluoroethylene) with a thickness of 5 mm, a width of 50 mm, and an aspect ratio of 4000:1 was wound on a reel a of a porous polymer film conveying subsystem 5 and fed into a magnetron sputtering subsystem 1 at a speed of 10 cm/min. In an inert gas (argon gas) environment at 38 degrees Celsius and an absolute pressure of 2 Pa, the surface power of an aluminum target in the magnetron sputtering subsystem 1 was controlled to be 5 W/cm$^2$, so that the aluminum target sputtered aluminum atoms to be continuously deposited on one side of the porous film of PTFE. An aluminum layer was thus formed with a thickness of 100 nm. A high-temperature aluminum vapor subsystem 2 was started. A number of aluminum particles were melted at 700 degrees Celsius in the existence of an inert gas (argon gas) in a melting bath of the high-temperature aluminum vapor subsystem 2. The molten aluminum particles were converted to an aluminum vapor with a partial pressure of 3% in the existence of argon gas, and the aluminum vapor was delivered to a low-temperature aluminum deposition subsystem 3. The temperature of the low-temperature aluminum deposition subsystem 3 was set to 250 degrees Celsius, the porous film of PTFE coming out of the magnetron sputtering subsystem 1 was continuously fed into the low-temperature aluminum deposition subsystem 3. The aluminum vapor was directly deposited on the side of the porous film of PTFE deposited with the aluminum atoms to form an aluminizing film, the deposition time was controlled at 10 minutes. An argon gas containing 5% oxygen was injected into the low-temperature aluminum deposition subsystem 3 from an inlet at a rear end to oxidize and remove the porous film of PTFE, and reduce the oxygen content of leftover gases from the low-temperature aluminum deposition subsystem 3 to an aluminum vapor recovery subsystem 4 to less than 1%. The aluminizing film coming out of the low-temperature aluminum deposition subsystem 3 was wound on a reel b of the porous polymer film conveying subsystem 5, the aluminizing film could be automatically turned over and returned to the magnetron sputtering subsystem 1 and the low-temperature aluminum deposition subsystem 3 in turn to deposit aluminum atoms and aluminum vapor on the aluminizing film to obtain a porous aluminum macroscopic body with an uniform aluminizing thickness on upper and lower sides for use of a porous aluminum current collector. The porous aluminum macroscopic body is a three-dimensional full-through-hole structure formed by connecting hollow aluminum wires, a wall thickness of the hollow aluminum wire is 7 microns. The porous aluminum macroscopic body has an overall porosity of 99%, a tensile strength of 0.8 MPa, and a compressive strength of 1.2 MPa.

Leftover gases containing excess aluminum vapor, applied inert gas (argon gas), and exhaust gases caused by burning the porous film of PTFE in the low-temperature aluminum deposition subsystem 3 were introduced into the aluminum vapor recovery subsystem 4. The excess aluminum vapor was condensed into solids of aluminum by cooling and separated from the leftover gases. Through cooling and separation, the aluminum solids and other gases were separated into two paths, and returned to the high-temperature aluminum vapor subsystem 2. The recovered aluminum solids and aluminum particles from outside were simultaneously used to generate high-temperature aluminum vapor. The other gases from the aluminum vapor recovery subsystem 4 were handled by to a harmless combustion treatment to be turned into an exhaust gas.

ratio of 9000:1 was wound on a reel a of a porous polymer film conveying subsystem 5 and fed into a magnetron sputtering subsystem 1 at a speed of 10 cm/min. In an inert gas (argon gas) environment at 40 degrees Celsius and an absolute pressure of 3 Pa, the surface power of an aluminum target in the magnetron sputtering subsystem 1 was controlled to be 7 W/cm$^2$, so that the aluminum target sputtered aluminum atoms to be continuously deposited on one side of the porous film of PE. An aluminum layer was thus formed with a thickness of 200 nm. A high-temperature aluminum vapor subsystem 2 was started. A number of aluminum particles were melted at 750 degrees Celsius in the existence of an inert gas (argon gas) in a melting bath of the high-temperature aluminum vapor subsystem 2. The molten aluminum particles were converted to an aluminum vapor with a partial pressure of 8% in the existence of argon gas, and the aluminum vapor was delivered to a low-temperature aluminum deposition subsystem 3. The temperature of the low-temperature aluminum deposition subsystem 3 was set to 300 degrees Celsius, the porous film of PE coming out of the magnetron sputtering subsystem 1 was continuously fed into the low-temperature aluminum deposition subsystem 3. The aluminum vapor was directly deposited on the side of the porous film of PE deposited with the aluminum atoms to form an aluminizing film, the deposition time was controlled at 2 minutes. An argon gas containing 10% oxygen was injected into the low-temperature aluminum deposition subsystem 3 from an inlet at a rear end to oxidize and remove the porous film of PE, and reduce the oxygen content of leftover gases from the low-temperature aluminum deposition subsystem 3 to an aluminum vapor recovery subsystem 4 to less than 1%. The aluminizing film coming out of the low-temperature aluminum deposition subsystem 3 was wound on a reel b of the porous polymer film conveying subsystem 5, the aluminizing film could be automatically turned over and returned to the magnetron sputtering subsystem 1 and the low-temperature aluminum deposition subsystem 3 in turn to deposit aluminum atoms and aluminum vapor on the aluminizing film to obtain a porous aluminum macroscopic body with an uniform aluminizing thickness on upper and lower sides for use of a porous aluminum current collector. The porous aluminum macroscopic body is a three-dimensional full-through-hole structure formed by connecting hollow aluminum wires, a wall thickness of the hollow aluminum wire is 70 microns. The porous aluminum macroscopic body has an overall porosity of 97%, a tensile strength of 1.4 MPa, and a compressive strength of 2.5 MPa.

Leftover gases containing excess aluminum vapor, applied inert gas (argon gas), and exhaust gases caused by burning the porous film of PE in the low-temperature aluminum deposition subsystem 3 were introduced into the aluminum vapor recovery subsystem 4. The excess aluminum vapor was condensed into solids of aluminum by cooling and separated from the leftover gases. Through cooling and separation, the aluminum solids and other gases were separated into two paths, and returned to the high-temperature aluminum vapor subsystem 2. The recovered aluminum solids and aluminum particles from outside were simultaneously used to generate high-temperature aluminum vapor. The other gases from the aluminum vapor recovery subsystem 4 were handled by to a harmless combustion treatment to be turned into an exhaust gas.

Example 4

Referring to FIG. 1, a porous film of polyethylene (PE) with a thickness of 10 mm, a width of 100 mm, and an aspect Example 5

Referring to FIG. 1, a porous film of PE (polyethylene) with a thickness of 20 mm, a width of 300 mm, and an aspect ratio of 4000:1 was wound on a reel a of a porous polymer film conveying subsystem 5 and fed into a magnetron sputtering subsystem 1 at a speed of 2 cm/min. In an inert gas (argon gas) environment at 25 degrees Celsius and an absolute pressure of 1 Pa, the surface power of an aluminum target in the magnetron sputtering subsystem 1 was controlled to be 4 W/cm$^2$, so that the aluminum target sputtered aluminum atoms to be continuously deposited on one side of the porous film of PE. An aluminum layer was thus formed with a thickness of 120 nm. A high-temperature aluminum vapor subsystem 2 was started. A number of aluminum particles were melted at 780 degrees Celsius in the existence of an inert gas (nitrogen gas) in a melting bath of the high-temperature aluminum vapor subsystem 2. The molten aluminum particles were converted to an aluminum vapor with a partial pressure of 0.4% in the existence of nitrogen gas, and the aluminum vapor was delivered to a low-temperature aluminum deposition subsystem 3. The temperature of the low-temperature aluminum deposition subsystem 3 was set to 200 degrees Celsius, the porous film of PE coming out of the magnetron sputtering subsystem 1 was continuously fed into the low-temperature aluminum deposition subsystem 3. The aluminum vapor was directly deposited on the side of the porous film of PE deposited with the aluminum atoms to form an aluminizing film, the deposition time was controlled at 10 minutes. A nitrogen gas containing 3.5% oxygen was injected into the low-temperature aluminum deposition subsystem 3 from an inlet at a rear end to oxidize and remove the porous film of PE, and reduce the oxygen content of leftover gases from the low-temperature aluminum deposition subsystem 3 to an aluminum vapor recovery subsystem 4 to less than 1%. The aluminizing film coming out of the low-temperature aluminum deposition subsystem 3 was wound on a reel b of the porous polymer film conveying subsystem 5, the aluminizing film could be automatically turned over and returned to the magnetron sputtering subsystem 1 and the low-temperature aluminum deposition subsystem 3 in turn to deposit aluminum atoms and aluminum vapor on the aluminizing film to obtain a porous aluminum macroscopic body with an uniform aluminizing thickness on upper and lower sides for use of a porous aluminum current collector. The porous aluminum macroscopic body is a three-dimensional full-through-hole structure formed by connecting hollow aluminum wires, a wall thickness of the hollow aluminum wire is 35 microns. The porous aluminum macroscopic body has an overall porosity of 89%, a tensile strength of 1.5 MPa, and a compressive strength of 3 MPa.

Leftover gases containing excess aluminum vapor, applied inert gas (nitrogen gas), and exhaust gases caused by burning the porous film of PE in the low-temperature aluminum deposition subsystem 3 were introduced into the aluminum vapor recovery subsystem 4. The excess aluminum vapor was condensed into solids of aluminum by cooling and separated from the leftover gases. Through cooling and separation, the aluminum solids and other gases were separated into two paths, and returned to the high-temperature aluminum vapor subsystem 2. The recovered aluminum solids and aluminum particles from outside were simultaneously used to generate high-temperature aluminum vapor. The other gases from the aluminum vapor recovery subsystem 4 were handled by to a harmless combustion treatment to be turned into an exhaust gas.

The beneficial effects of such method are:

(1) Compared with a method of depositing aluminum by pure electroplating, the method in the present disclosure is 20 times faster and the cost is 90% lower.

(2) Compared with a simple sputtering technology, the deposition speed in the present disclosure is 5 times faster, and the cost is reduced 50%. Compared to the aluminum deposited by simple sputtering with the polymer template removed, the obtained product in the present disclosure has an increase of 50-80% in tensile strength. The oxygen content of the obtained product in the present disclosure is reduced by 50%. The prepared porous aluminum macroscopic body has the characteristics of high porosity and high strength.

(3) Compared with the simple high-temperature physical steam-plating method, the problem of not directly applying the thousand-porous polymer template is solved, and the surface finish of the obtained product in the present disclosure is 10-20% higher than that of the simple high-temperature steam-plating method.

(4) The heat source and equipment of the high-temperature aluminum vapor generation subsystem are effectively utilized, so that the step of removing the polymer template is reduced by 20%, the cost is reduced by 50%, which is environmentally an improvement.

The embodiments shown and described above are only examples. Many details are often found in the relevant art, therefore, many such details are neither shown nor described. Even though numerous characteristics and advantages of the embodiments have been set forth in the foregoing description, together with details of the structure and function of the embodiments, the present disclosure is illustrative only, and changes may be made in details, including in the matters of shape, size, and arrangement of parts within the principles of the embodiments to the full extent indicated by the broad general meaning of the terms in which the appended claims are expressed.

What is claimed is:

1. A fabrication system for preparing a porous aluminum macroscopic body, the fabrication system comprising a magnetron sputtering subsystem (1), a high-temperature aluminum vapor subsystem (2), a low-temperature aluminum deposition subsystem (3), an aluminum vapor recovery subsystem (4), and a porous polymer film conveying subsystem (5); wherein the temperature of the high-temperature aluminum vapor subsystem (2) is 600-800 degrees Celsius, the temperature of the low-temperature aluminum deposition subsystem (3) is 200-300 degrees Celsius, the porous polymer film conveying subsystem (5) is connected with the magnetron sputtering subsystem (1) and the low-temperature aluminum deposition subsystem (3) to form a path for a porous polymer film; the high-temperature aluminum vapor subsystem (2), the low-temperature aluminum deposition subsystem (3), and the aluminum vapor recovery subsystem (4) are interconnected to form paths for supply, deposition, and recovery of aluminum;

wherein the low-temperature aluminum deposition subsystem (3) is provided with an inlet for a gas containing oxygen in a direction near the porous polymer film conveying subsystem (5) at a rear end; while depositing an aluminum vapor, the porous polymer film is burned by utilizing the temperature of the aluminum vapor, so an aluminizing film which comes out of the low-temperature aluminum deposition subsystem (3) is without any carbon element;

wherein the aluminum vapor recovery subsystem (4) comprises an air induction system to introduce leftover gases containing inert gas, exhaust gases caused by burning the porous polymer film, and excess aluminum vapor in the low-temperature aluminum deposition subsystem (3) into the aluminum vapor recovery subsystem (4); the aluminum vapor condenses into solids of aluminum by cooling, and the aluminum solids are separated from the leftover gases, the aluminum solids and other gases return to the high-temperature aluminum vapor subsystem (2).

2. The fabrication system of claim 1, wherein the high-temperature aluminum vapor subsystem (2) converts the aluminum solids recovered from the aluminum vapor recovery subsystem (4) and aluminum particles from outside the fabrication system into aluminum vapor; at the same time, the other gases passed into the high-temperature aluminum vapor subsystem (2) by the aluminum vapor recovery subsystem (4) are combusted into an exhaust gas, and the exhaust gas is expelled from the high-temperature aluminum vapor subsystem (2).

* * * * *